(12) United States Patent
Dawkins et al.

(10) Patent No.: US 11,075,784 B1
(45) Date of Patent: Jul. 27, 2021

(54) WIDEBAND MULTIPHASE TRANSMITTER WITH TWO-POINT MODULATION

(71) Applicant: Apple Inc., Cupertino, CA (US)

(72) Inventors: Mark T. Dawkins, Campell, CA (US); Yi-An Li, Sunnyvale, CA (US); Yen-Ling Huang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/014,927

(22) Filed: Sep. 8, 2020

(51) Int. Cl.
*H04L 27/20* (2006.01)
*H04L 27/26* (2006.01)
*H04L 7/033* (2006.01)

(52) U.S. Cl.
CPC ............ *H04L 27/20* (2013.01); *H04L 7/0331* (2013.01); *H04L 27/2601* (2013.01)

(58) Field of Classification Search
CPC . H03L 2207/50; H03L 7/0814; H03L 7/0991; H04L 27/2032; H04L 27/20; H04L 7/0331; H04L 27/22601; H04L 27/2003; H04L 27/2092; H04L 27/365; H04L 5/0007; H04L 27/205
See application file for complete search history.

(56) References Cited

U.S. PATENT DOCUMENTS

| | | | | |
|---|---|---|---|---|
| 7,532,679 | B2 * | 5/2009 | Staszewski | H03F 3/24 375/295 |
| 8,044,742 | B2 * | 10/2011 | Sun | H04L 27/361 332/103 |
| 8,076,960 | B2 | 12/2011 | Geng et al. | |
| 8,433,026 | B2 | 4/2013 | Ballantyne et al. | |
| 8,723,613 | B2 * | 5/2014 | Sun | H03C 3/00 332/103 |
| 8,798,191 | B2 * | 8/2014 | Matsuura | H03F 3/195 375/295 |
| 9,000,858 | B2 * | 4/2015 | Sun | H04L 27/2003 332/144 |
| 9,270,509 | B1 * | 2/2016 | Agon | H04L 27/367 |
| 9,806,880 | B1 | 10/2017 | Wiklund et al. | |
| 2006/0038710 | A1 * | 2/2006 | Staszewski | H03M 1/005 341/143 |
| 2008/0198958 | A1 * | 8/2008 | Shin | H03L 7/085 375/376 |
| 2009/0275358 | A1 * | 11/2009 | Feltgen | H03C 3/0925 455/550.1 |
| 2009/0275359 | A1 * | 11/2009 | Puma | H04L 27/361 455/550.1 |

* cited by examiner

*Primary Examiner* — Khanh C Tran
(74) *Attorney, Agent, or Firm* — Kowert, Hood, Munyon, Rankin & Goetzel, P.C.

(57) ABSTRACT

The present disclosure is directed a wideband multiphase transmitter with two-point modulation. A transmitter includes a control circuit configured to receive a source signal having amplitude and phase components. Using the phase component, the control circuit generates a frequency control signal and a phase jump signal. The transmitter further includes a phase conversion circuit configured to generate a first phase-modulated signal using the phase component and the frequency control signal. The phase conversion circuit is also configured to adjust the phase of the first phase-modulated signal using the phase jump signal. The first phase-modulate signal and the amplitude component are provided to an amplifier, which generates a transmit signal based thereon.

20 Claims, 8 Drawing Sheets

WIDEBAND MULTIPHASE TRANSMITTER WITH TWO-POINT MODULATION

BACKGROUND

Technical Field

This disclosure is directed to transmitters, and more particularly, transmitters that utilize two-point modulation.

Description of the Related Art

Many radio frequency (RF) communications systems utilize polar modulation. In systems using polar modulation, a signal includes an amplitude component and a phase component. A transmitter utilizing polar modulation includes a polar amplifier to provide the output signal. A polar amplifier may receive the phase component on its input, while its voltage input may the amplitude component. Modulation of the signal may be performed by varying both the phase and amplitude components of an RF signal.

Systems that utilize orthogonal frequency division multiplexing (OFDM) often times utilize polar transmitters. Various OFDM systems utilize use digital modulation to encode digital data onto multiple carrier frequencies, which are sometimes referred to as sub-carriers. These systems may be employed in various types of wideband digital communications systems, such as communication between mobile devices and wireless networks. Since these systems may have a high peak-to-average power ratio, the use of polar amplifiers may be used to provide the desired efficiency.

SUMMARY

The present disclosure is directed to a wideband multiphase transmitter with two-point modulation. In one embodiment, a transmitter includes a control circuit configured to receive a source signal having amplitude and phase components. Using the phase component, the control circuit generates a frequency control signal and a phase jump signal. The transmitter further includes a phase conversion circuit configured to generate a first phase-modulated signal using the phase component and the frequency control signal. The phase conversion circuit is also configured to adjust the phase of the first phase-modulated signal using the phase jump signal. The first phase-modulate signal and the amplitude component are provided to an amplifier, which generates a transmit signal based thereon.

In one embodiment, the transmitter is configured to perform two-point modulation. Accordingly, the phase control circuit in such an embodiment includes a two-point phase locked loop (PLL) into which modulation data is injected at two different points. The transmitter may also include a signal source, which may be arranged to be provided source signals for orthogonal frequency division multiplexing (OFDM) signals. The control circuit may generate the frequency control signal based on a phase change of an OFDM signal (relative to a previous sample) provided from the signal source. The frequency control signal may be provided to the two-point PLL. At one of the points, the frequency control signal may be limited so as to also limit the voltage provided to a voltage-controlled oscillator (VCO) of the two-point PLL.

BRIEF DESCRIPTION OF THE DRAWINGS

The following detailed description makes reference to the accompanying drawings, which are now briefly described.

Figure 1:
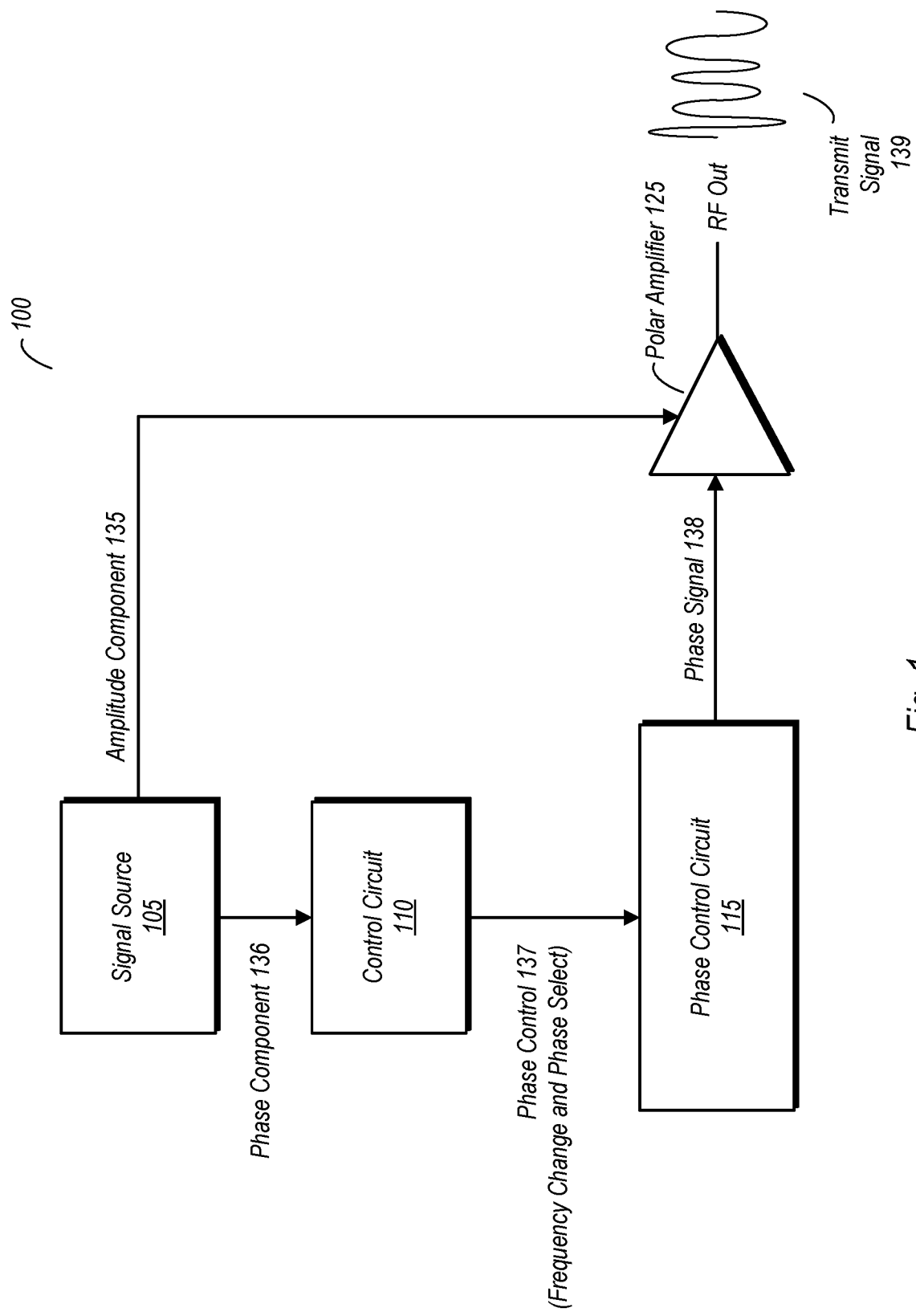
FIG. 1 is a block diagram of a first embodiment of a transmitter system.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a transmitter that utilizes two-point modulation. To that end, the transmitter includes a two-point phase-locked loop (PLL). In various embodiments, the transmitter is a wideband, polar transmitter having a phase path and an amplitude path. Such transmitters, when utilizing orthogonal frequency division multiplexing (OFDM) can have very high values of peak-to-average power ratio (PAPR) of complex OFDM waveforms. The phase path of various embodiments disclosed herein may be implemented, using frequency modulation, with a two-point PLL. This may result in lower power consumption and implementation in a smaller silicon area.

Implementation of a two-point modulator can be very challenging for wideband signals, including wideband OFDM signals. These signals may exhibit large (essentially unbounded) frequency deviations ($d\phi/dt$) from one sample to the next. Since the two-point PLL may need to adjust to these jumps, the requirements on a VCO (or DCO, digitally controlled oscillator) of the PLL can become complex to the point of being impractical. The present disclosure implements a transmitter in which the frequency deviation range of the VCO is limited, thereby enabling a design of minimized complexity.

A signal to be transmitted in a polar form may be represented by the equation $s(t)=r(t)e^{j\phi(t)}$, with $r(t)$ representative of the amplitude component and $\phi(t)$ representative of the phase component. The derivative of the phase component for a particular sample is represented by $\Delta f_i(t)=d\phi(t)/dt$, which is thus representative of the instantaneous frequency of the signal at time t (which can also be defined as the time rate of change of the phase at time t). However, the complex trajectory of s(t) for OFDM can change significantly in a very short period of time, thereby resulting in large values of $\Delta f_i(t)$. Since the tuning range of a VCO/DCO in a 2-point PLL of a wideband system is based on the values of $\Delta f_i(t)$, very large values of this quantity can render the design of such a system impractical.

The transmitter system of the present disclosure, in various embodiments, limits the range of value representing $\Delta f_i(t)$, as applied to a two-point PLL, such that the design of a VCO/DCO can be made practical while still enabling the implementation of a wideband communications system. In addition to limiting the overall range, various embodiments of the transmitter system disclosed herein may limit the number of discrete values that $\Delta f_i(t)$ can take, further reducing the complexity of the VCO/DCO. Various embodiments of such a system and components thereof are now discussed in further detail below.

FIG. 1 is a block diagram of a first embodiment of a transmitter system. In the embodiment shown, transmitter system 100 includes a signal source 105 configured to output a source signal having an amplitude component 135 and a phase component 136. A control circuit 100 is coupled to receive the phase component 136 of the source signal. Based on the phase component 136, control circuit 100 is configured to generate phase control signals 137. The phase control signals are received by phase control circuit 115. Based on these phase control signals 137, phase control circuit 115 outputs a phase signal to an input of polar amplifier 125. Polar amplifier 125 is also coupled to receive the amplitude component 135 of the source signal. Based on the phase signal 138 and the amplitude component 135, polar amplifier 125 generates transmit signal 139 that, over time, varies in amplitude, phase, and frequency.

In the embodiment shown, the phase control signals provided by control circuit 100 include a frequency control signal and a phase jump signal, both of which are generated using the phase component received from signal source 105 (and are discussed below with reference to FIGS. 2 and 3). The frequency control signal may be generated based on a change of the phase component relative to a previous sample of source signal. These changes may occur, e.g., between successive data samples upon which the source signal is based. In response to a determination that a difference in values (e.g., instantaneous frequency, or $d\phi(t)/dt$) between successive values (e.g., from successive samples) of the phase component is greater than a threshold value, generate a phase jump signal.

Phase control circuit 115 in the embodiment shown may generate, using the phase component 136 and the frequency control signal, a first phase-modulated signal using a reference signal. Additionally, phase control circuit 115 may adjust a phase of the first phase-modulated signal using the phase jump signal. Polar amplifier 125 of the illustrated embodiment is an amplifier circuit configured to generate a transmit signal using the amplitude component and the first phase-modulate signal ('phase signal' in the drawing).

Figure 2:
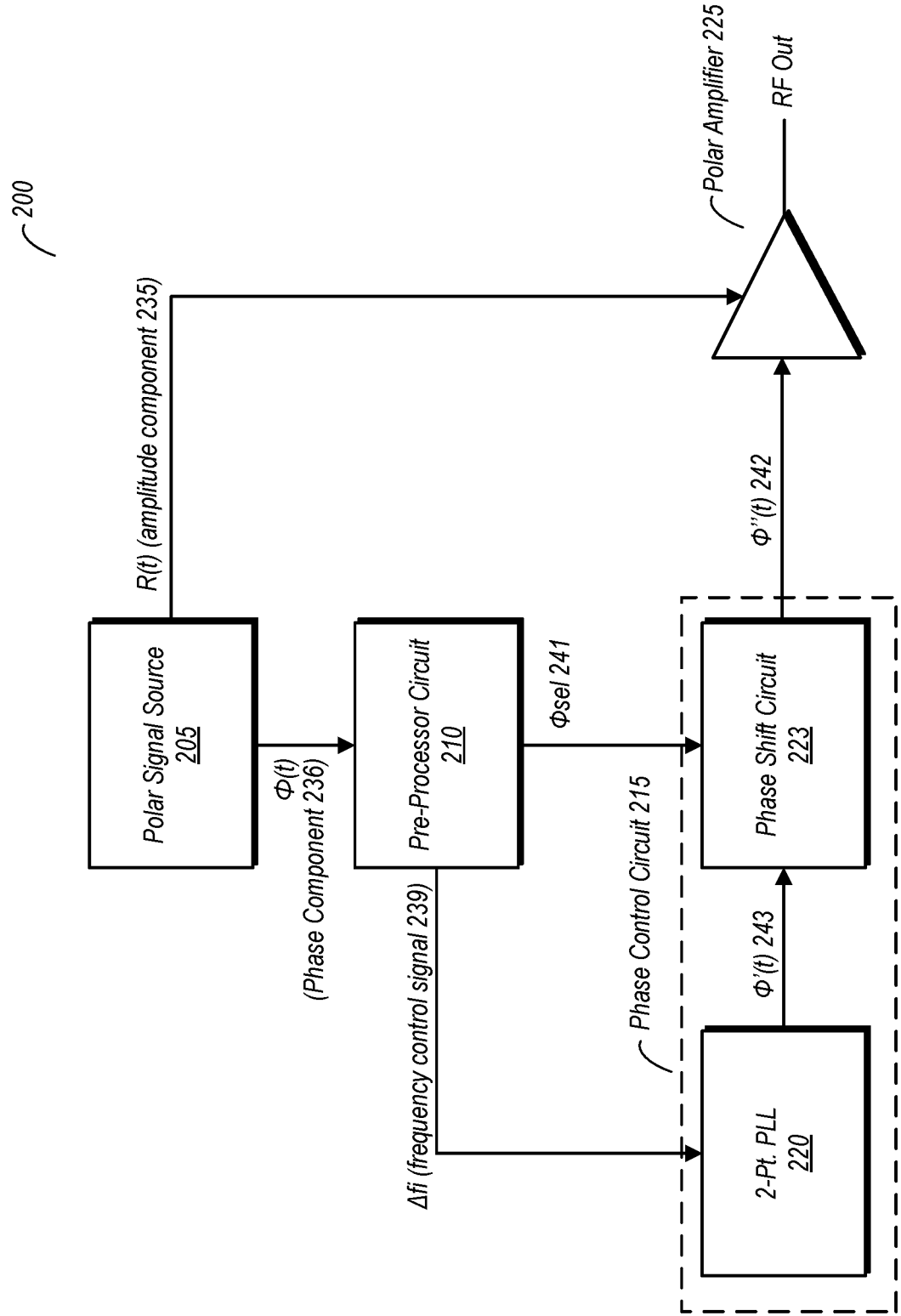
FIG. 2 is a block diagram of a second embodiment of a transmitter system.

FIG. 2 illustrates another embodiment of a transmitter system. In the embodiment shown, transmitter 200 includes a polar signal source 205 configured to output a source signal having an amplitude component, R(t) 235, and a phase component, $\phi(t)$ 236. The polar signal source 205 may be coupled to other circuitry, e.g., a baseband circuit (not shown) that generates the information that in turn provides the basis for modulating the RF carrier(s) of the system. The amplitude component R(t) 235 is provided to polar amplifier 225 in the embodiment shown. Variations in the amplitude component R(t) 235 may cause corresponding variations in the voltage amplitude of the transmit signal output from polar amplifier 225. Polar amplifier 225 is also coupled to receive a first phase-modulate signal, $\phi''(t)$ 242, from phase control circuit 215. The first phase-modulate signal, $\phi''(t)$ 242 may have a frequency that is equivalent to that of the phase component $\phi(t)$ 236, of the source signal.

Pre-processor circuit 210 in the embodiment shown is a control circuit that performs processing functions to generate various control signals used for a phase component, $\phi(t)$ 236, that is input provided to polar amplifier 225. A first control signal generated by pre-processor circuit 210 is a frequency control signal, $\Delta f_i$ 239. The signal $\Delta f_i$ 239 may be representative of an instantaneous frequency change between successive samples, e.g., data samples received from a baseband circuit by polar signal source 205. In determining and updating a value of $\Delta f_i$ 239, pre-processor circuit 210 may calculate a phase change to $\phi(t)$ 236, between a current sample and a preceding sample. This phase change can be expressed as $d\phi/dt$. Furthermore, the value of $d\phi/dt$ may be quantized to limit a number of discrete values included in the frequency control signal. That is, the range and accuracy of $\Delta f_i$ 239 may be limited by the quantization. In some embodiments, the step sizes used in the quantization may be non-uniform, as will be discussed in further detail below. The frequency control signal $\Delta f_i$ 239 is provided, in the embodiment shown, to two-point PLL 220 that is implemented in phase control circuit 215.

Pre-processor circuit 210 in the embodiment shown is also configured to generate a phase jump signal, $\phi$sel 241. At certain times, large phase changes between successive samples of the source signal may occur, or in other words high values of instantaneous frequency may be caused by the values of two consecutive samples. If the phase change between two successive samples exceeds a threshold value, the value of $\phi$sel 241 is incremented by pre-processor circuit 210 of the embodiment shown. For example, consider a situation in which the instantaneous phase change between two successive samples is 1670 and the number of possible phase increments is two (2). If the threshold is set at 90°, $\phi$sel 241 may be incremented to 180°, which may be one of a number of discrete phase values. As a result, the actual point to be synthesized may be shifted to be 180° ahead of the current phase. Generally speaking, the number of possible phase increments may vary from one embodiment to another. In addition to there being two possible phase increments in one embodiment, embodiments having four, eight, or any other suitable number of phase increments are possible and contemplated.

The phase shift signal, $\phi$sel 241 generated by pre-processor circuit 210 is provided to a phase shift circuit 223 implemented in phase control circuit 215. Phase shift circuit 223 in the embodiment shown is also coupled to receive a second phase-modulate signal, $\phi'(t)$ 243, that is output from two-point PLL 220. The frequency of the second phase-modulate signal, $\phi'(t)$ 243, is dependent at least in part on the frequency control signal, $\Delta f_i$ 239. In some embodiments, this frequency may be greater than that of the frequency of the source signal, and thus the frequency of the first phase-modulate signal as well. Phase shift circuit 223 in the embodiment shown may generate the second phase-modulate signal, $\phi''(t)$ 242, based on both the first phase-modulate signal, $\phi'(t)$ 243, and the phase select signal, $\phi$sel 241. As noted above, the second phase-modulate signal, $\phi''(t)$ 242, is provided to polar amplifier 225 along with a corresponding amplitude component, R(t) 235, to generate a transmit signal provided by transmitter 200.

Figure 3:
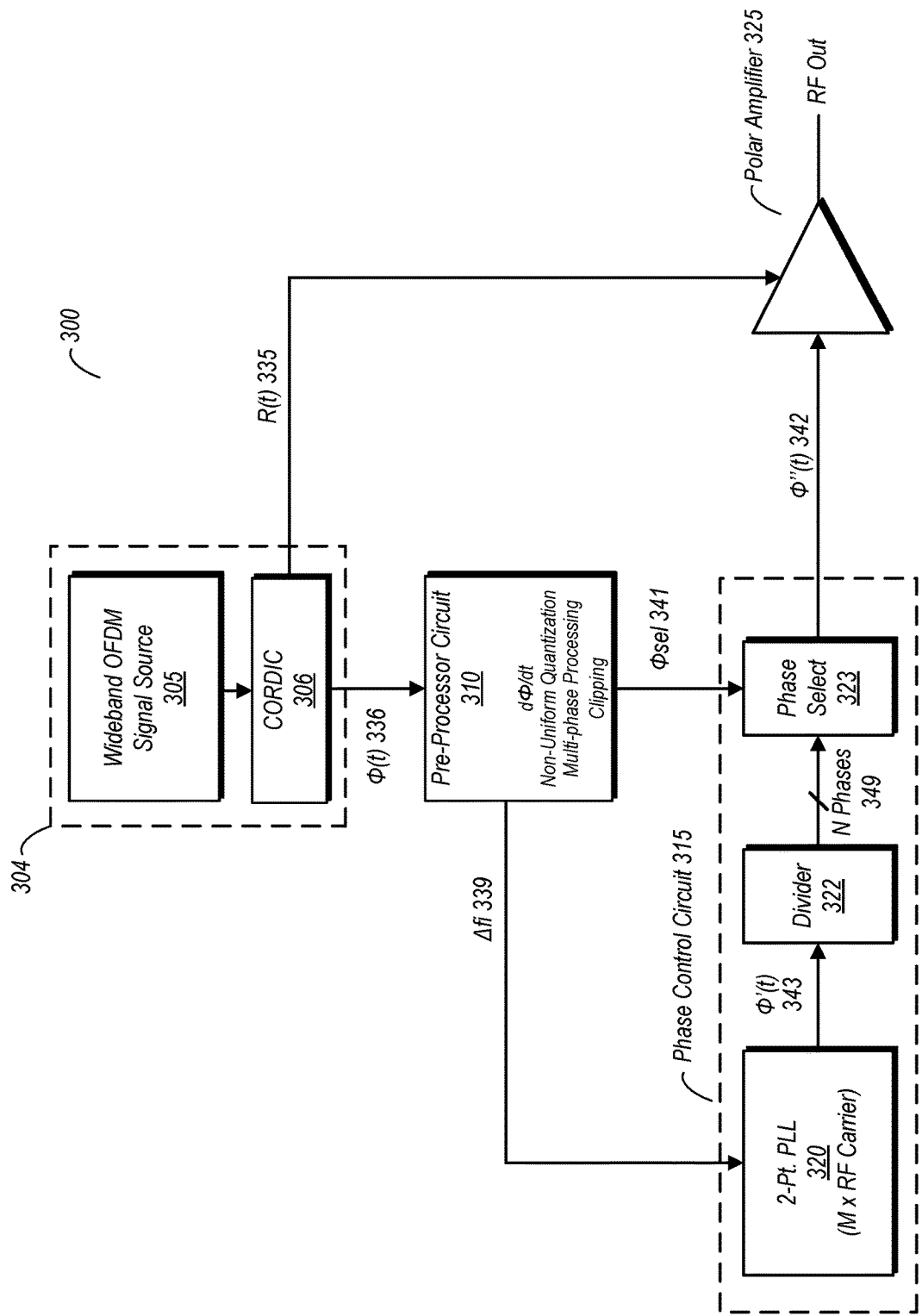
FIG. 3 is a block diagram of a third embodiment of a transmitter system.

FIG. 3 is a block diagram of a third embodiment of a transmitter system. In the embodiment shown, transmitter system 300 includes a polar signal source 304 that includes a wideband OFDM signal source 305, and CORDIC (Coordinate Rotation Digital Computer) 306. Based on the data/modulation signals received from a baseband circuit (not shown), wideband OFDM signal source 305 may generate signals for the various subcarriers that comprise OFDM signals for the particular embodiment. The combined signal may be received by CORDIC 306, which may implement circuitry to calculate various trigonometric functions associated with the phase component of signals received from wideband OFDM signal source 305. CORDIC 306 may output both the amplitude component, R(t) 335, and phase component, $\phi(t)$ 336, to preprocessor circuit 310. In some embodiments, CORDIC 306 may be followed by, e.g., digital signal processing (DSP) circuits and digital-to-analog converters (DACs) to output the analog versions of the components of the source signal.

Pre-processor circuit 310 in the embodiment shown is a control circuit arranged to perform processing to generate the control signals $\Delta f_i$ 339 and $\phi$sel 341. In generating these signals, pre-processor circuit 310 determines a difference in values between successive values of the phase component of the OFDM signal. In determining this difference, pre-processor circuit 310 determines a phase shift between the two successive values (or samples) of the OFDM signal, and thus may calculate $d\phi/dt$. Pre-processor circuit 310 may also perform a non-uniform quantization of this instantaneous frequency (discussed in further detail with reference to FIG. 5), as well as performing multi-phase processing functions (e.g., generation of the sel 341), and clipping of the instantaneous frequency value. Clipping may include computing an error any time that the value of $\Delta f_i$ exceeds a threshold value. When $\Delta f_i$ exceeds the threshold, $\Delta f_i$ may be set to a maximum value, $\Delta f_i=\Delta f_i$ (max). The calculated error in this case is the residual (or missing) phase, do, that is not added to the output signal due to clipping. The missing phase may then be added to the number of samples thereafter (e.g., 1-3 samples) so that the long term accumulated phase is correct. Based on the performance of these functions, pre-processor circuit 310 generates the control signals $\Delta f_i$ 339 and $\phi$sel 341.

Phase control circuit 315 in this particular embodiment includes two-point PLL 320, divider 322, and phase select circuit 323. Two-point PLL 320 in the illustrated embodiment generates a phase modulates signal $\phi'(t)$ 343 centered at a frequency greater than that of the eventual output signal. Divider 322 divides the nominal RF frequency of $\phi'(t)$ 343 to produce output signals centered at frequency that is equal to that of the eventual output signal. In performing the frequency division, divider 322 produces a number of signals having the same frequency but different phases with respect to one another. These signals are provided to phase select circuit 323, from which one is selected as a phase-modulate signal ϕ"(t) 342 that is input into polar amplifier 325.

Two-point PLL 320 in the embodiment shown is coupled to receive $\Delta f_i$ 339, and generates a phase-modulate signal, ϕ'(t) 343. In the embodiment shown, the ϕ'(t) 343 is generated at a frequency that is M times the frequency of the RF carrier that is desired to be output from the RF out node of polar amplifier 325. Accordingly, divider 322, which is coupled to receive ϕ'(t) 343 from two-point PLL 320, is arranged to divide the frequency of ϕ'(t) 343 by M. For example, in one embodiment, two-point PLL 320 generates ϕ'(t) 343 at a frequency that is four (4) times the RF carrier frequency, while divider 322 divides the frequency of ϕ'(t) 343. Designing the two-point PLL 320 to generate the frequency of ϕ'(t) 343 at M times the RF carrier frequency before subsequently performing frequency division, a VCO (or DCO) of PLL 320 may be implemented with a practical design while transmitter 300 overall is able to handle the instantaneous frequency changes that are common in OFDM system. In particular, the frequency shifts required by the VCO/DCO may be kept within a feasible range.

In dividing the frequency of ϕ'(t) 343, divider 322 of the illustrated embodiment generates N different phases 349 of the divided phase-modulate signal ϕ'(t) 343. The phase select signal (or phase jump signal), ϕsel 341 is used to select one of these phases to be provided as ϕ"(t) 342 for input into polar amplifier 325. Generation of ϕsel 341 may be performed in the same manner as discussed above, namely by generation ϕsel 341 based on an instantaneous phase difference between the current and previous sample exceeding a threshold. The selected one of the N phases is then output as the phase-modulate input signal, ϕ"(t) 342, to polar amplifier 325, which also receives the amplitude component of the original source signal, R(t) 335. Based on these two inputs, polar amplifier 325 provides an RF output signal that varies in amplitude R(t) 335 changes, and in varies in phase and frequency with changes to ϕ"(t) 342.

It is noted that, in either of the embodiments of FIG. 3, the frequency dividing and phase selection functions provided by divider 322 and phase select circuit 323, respectively, may be incorporated into two-point PLL 320.

Figure 4:
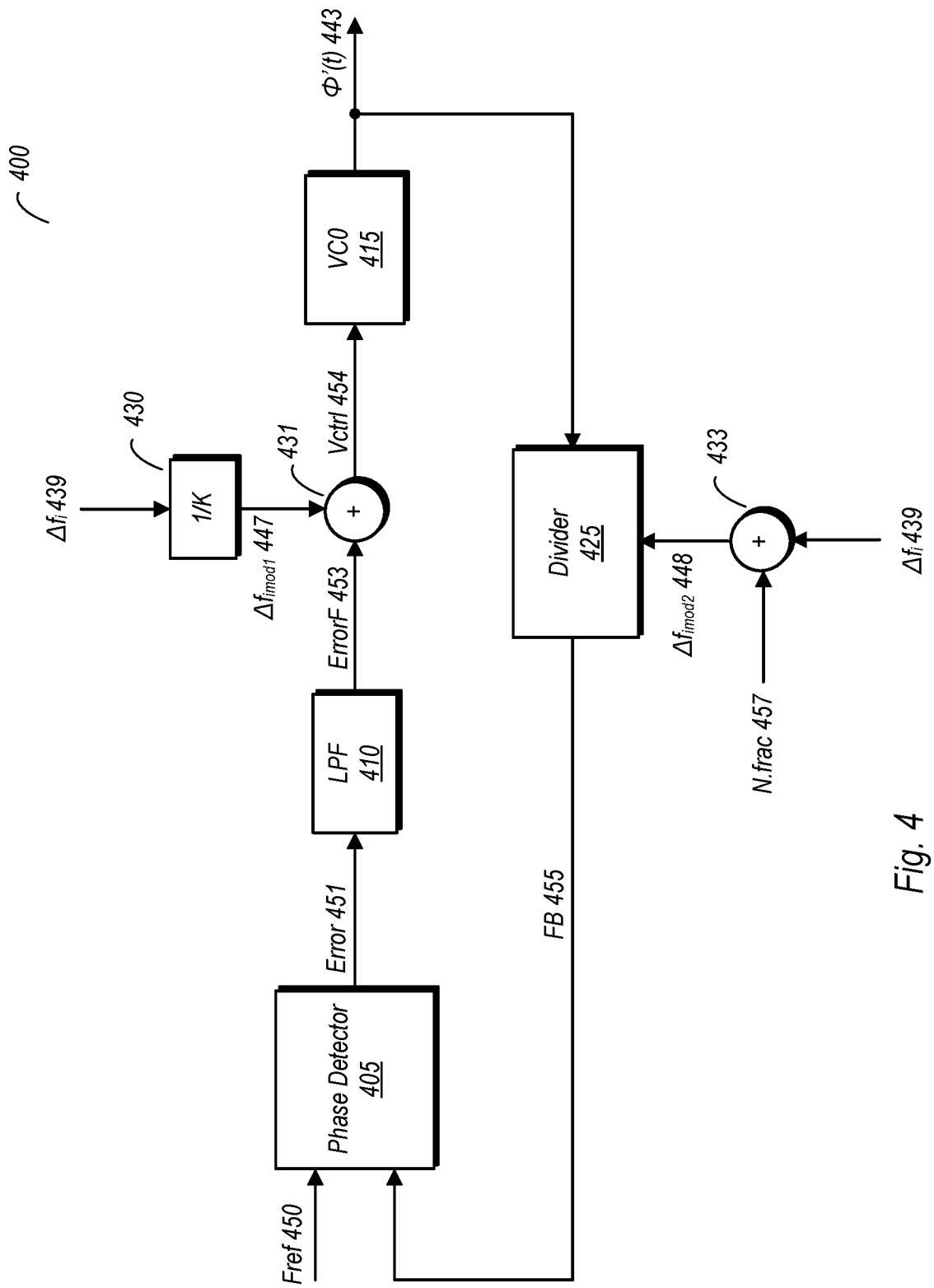
FIG. 4 is a block diagram of one embodiment of a phase-locked loop (PLL).

FIG. 4 is a block diagram of one embodiment of a phase-locked loop (PLL). As the name implies, modulation data (in the form of $\Delta f_i$ 439 in this particular example) is injected into two-point PLL 400 at two different points, as shown in the drawing. In the embodiment shown, two-point PLL 400 is arranged to inject a frequency control signal, $\Delta f_i$ 439, which may be provided from, e.g., a control/pre-processor circuit such as those shown in any of FIGS. 1-3. The frequency control signal, $\Delta f_i$ 439, may thus form the basis for the frequency modulation performed by various embodiments of the transmitter discussed herein, and is input at two different points. It is noted that $\Delta f_i$ 439 may, in some embodiment, be generated as a digital signal (e.g., through the quantization discussed in reference to FIG. 5). However, $\Delta f_i$ 439 may be converted to an analog equivalent where needed in certain embodiments. Accordingly, some embodiments may also include one or more digital to analog converters (DACs) for inputs of $\Delta f_i$ 439 that are provided to two-point PLL 400.

Two-point PLL in the embodiment shown includes a phase detector circuit 405, which receives a reference signal, Fref 450, and a feedback signal, FB 455. Ideally, Fref 450 and FB 455 are provided at the same frequency. Based on any detected phase differences between these two signals, phase detector 405 generates (as a voltage) a first error signal, Error 451. Low pass filter 410 in the embodiment shown attenuates any high-speed transients that may be present in Error 451. The output of low pass filter 410 is a filtered error signal, ErrorF 453.

A voltage summation circuit 431 in the embodiment shown is coupled to receive the filtered error signal, ErrorF 453, and a first modified frequency control signal, $\Delta f_{i_{mod1}}$ 447. The latter signal is output from modifier circuit 430, which output a voltage corresponding to a modification of $\Delta f_i$ 439 by a factor of 1/K. The value of K shown here is represents the value KVco, which is the transfer function of the voltage-controlled oscillator (VCO) 415 in Hz/V. Summation circuit 431 sums of the voltages of ErrorF 453 and $\Delta f_{i_{mod1}}$ 447 to generate a voltage control signal, Vctrl 454. VCO 415 generates a phase-modulate signal ϕ'(t) 443 at a frequency corresponding to the voltage of Vctrl 454. In various embodiments, modifier circuit 430 may be a digital circuit having a DAC to for generating $\Delta f_{i_{mod1}}$ 447 as an analog voltage signal. In other embodiments, modifier circuit 430 may be an analog circuit, with $\Delta f_i$ 439 provided as an analog voltage signal.

VCO 415 in the embodiment shown may be one of any suitable type of voltage-controlled oscillator. For example, VCO 415 may be implemented as a switched-capacitance voltage-controlled oscillator, in which an LC tank circuit is formed using an inductance and, e.g., an array of switched capacitors. Embodiments utilizing a variable capacitor (varactor) are also possible and contemplated. In a switched capacitance embodiment, the capacitance of the LC tank circuit may be changed by selecting particular ones of capacitors in the array based on the control signal Vctrl 454. Varying this capacitance may thus be used to vary the frequency of the output signal, in this case ϕ'(t) 443. Since the effect of generating the frequency control signal $\Delta f_i$ 439 is to limit the instantaneous frequency to ϕ'(t) 443, the array of switched capacitors may be reduced in size and number of capacitors used, thereby enabling a more practical design.

It is noted that embodiments are possible and contemplated in which a digitally-controlled oscillator (DCO) is used in place of VCO 415. In such embodiments, two-point PLL may be modified accordingly to provide digital signals at certain points to generate a digital code upon with the DCO would generate the output signal. For example, rather than generating a control signal (e.g., Vctrl 454) as an analog voltage, a two-point PLL having a DCO may instead generate a digital code that is used to determine the frequency of the output signal.

Two-point PLL 400 in the embodiment shown includes a feedback loop. The feedback loop includes divider 425, which is coupled to receive the phase-modulate signal ϕ'(t) 443. In addition to receiving ϕ'(t) 443, divider 425 also receives a second modified frequency control value, $\Delta f_{i_{mod2}}$ 448. The second modified frequency control signal $\Delta f_{i_{mod2}}$ 448 is output from summation circuit 433, which is coupled to receive $\Delta f_i$ 439. The other input to summation circuit 443 in the embodiment is the signal N.frac 447. The value N.frac is static, and sets the desired RF carrier frequency around which the VCO output signal's frequency will deviate in accordance with $\Delta f_i(t)$. The output of divider 425 is the feedback signal, FB 455, which is provided to one input of the phase detector 405.

Figure 5:
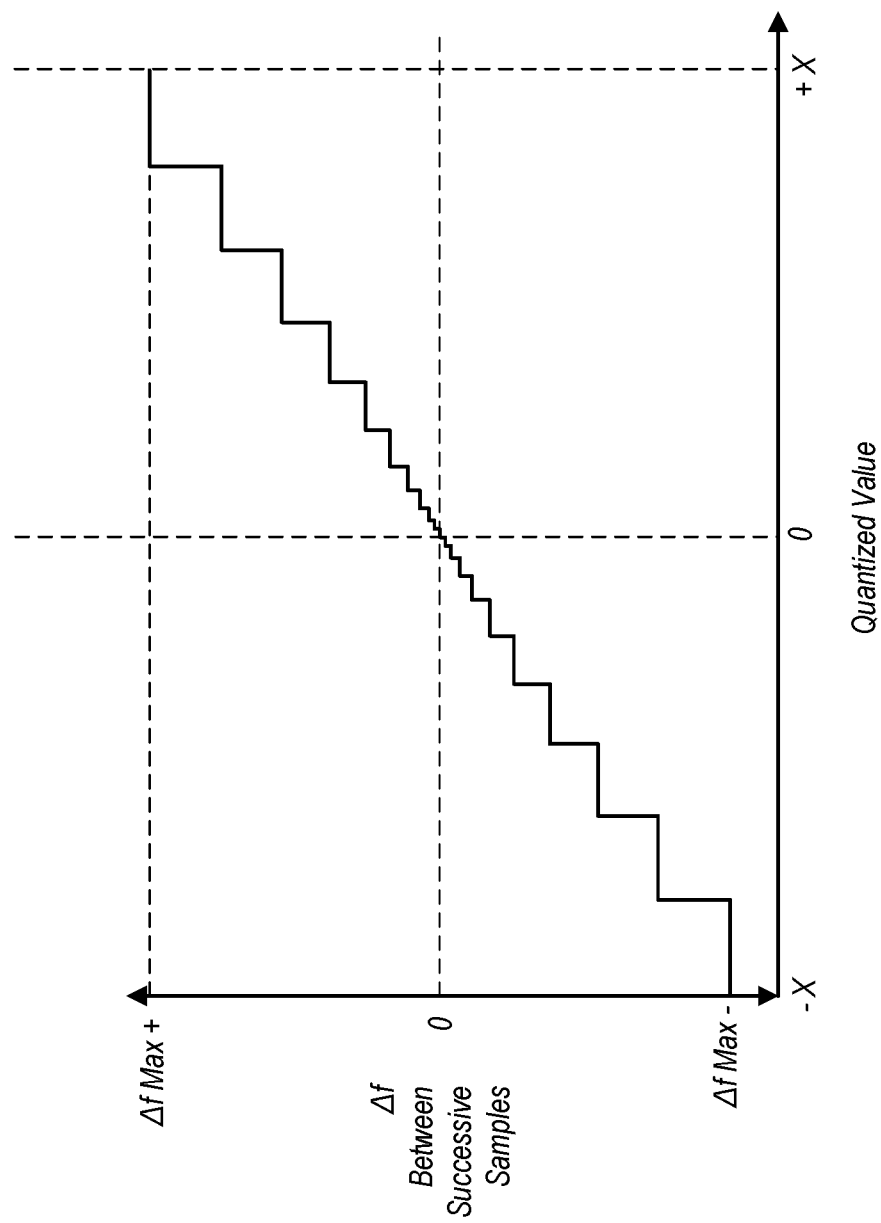
FIG. 5 is a drawing graphically illustrating non-uniform quantization performed in one embodiment of a transmitter system.

FIG. 5 is a drawing graphically illustrating non-uniform quantization performed in one embodiment of a transmitter system. As previously noted above, a control/pre-processor circuit (such as those illustrated in the embodiments of FIGS. 1-3) performs a quantization of the value of the instantaneous frequency of the source signal. Some embodiments perform this quantization using non-uniform steps. This is illustrated graphically in FIG. 5. The graph illustrates a quantized value on the horizontal axis, which may be a digital value that varies between values of −X and X, with a value of zero halfway between. The vertical axis represents the frequency shift between successive samples, which range between a value of Δf Max+ and Δf Max−, which represent the maximum possible frequency shifts relative to zero. Above zero on the vertical axis thus represents a positive value of the frequency shift, while values below zero on the vertical axis represent a negative value of the frequency shift.

For frequency shifts that are closer to zero, the quantization steps are smaller. Accordingly, the resulting frequency control signal (e.g., $\Delta f_i$ 339 for the embodiment of FIG. 3) is subject to a relatively fine adjustment for small frequency shifts. As the frequency shifts become farther away from zero, the distance between these values required to increment the quantized value become larger. Accordingly, fewer adjustments are made for large frequency shifts than for small frequency shifts. The non-uniform quantization as illustrated in FIG. 5 is based on the insight that larger frequency shifts occur much less frequently over time than smaller frequency shifts.

By performing a quantization in a non-uniform manner, the number of discrete values of the quantization may be limited when mapping a frequency shift to the value of, e.g., the frequency control signal $\Delta f_i$ 339. By reducing the number of discrete values to be used to represent frequency shifts of the source signal, the complexity of a VCO or DCO used in a two-point PLL may be reduced. For example, in a VCO that implements banks of switched capacitors, the number of possible switching states that can be applied to adjust a corresponding LC tank circuit may be reduced.

Figure 6:
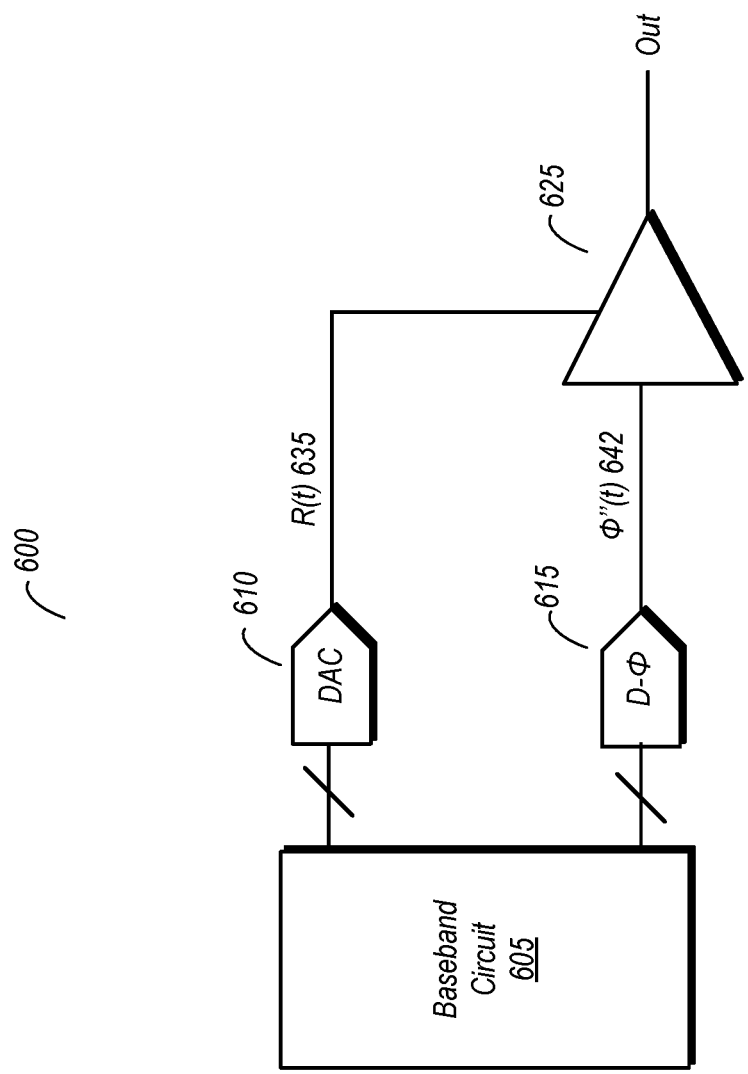
FIG. 6 is a block diagram of a fourth embodiment of a transmitter system.

FIG. 6 is a block diagram of a fourth embodiment of a transmitter system. Transmitter 600 may encompass the various components of the transmitters discussed above with reference to FIGS. 1-3. In the embodiment shown, transmitter 600 includes a baseband circuit 605 in which the information to be transmitted may be generated. This information may be generated using various types of digital circuitry, and may be formatted in various ways, e.g., as packets, frames, or any other suitable unit. Baseband circuit 605 may encompass at least a portion of a signal source, such as signal source 105 of FIG. 1 or that shown in other embodiments discussed herein.

Information from baseband circuit 605 may be provided to a DAC 610 and a digital-to-phase conversion circuit 615. DAC 610 may output an amplitude component, R(t) 635, of the source signal. Meanwhile, digital-to-phase conversion circuit 615 may output a phase-modulate signal $\phi''(t)$ 642. Digital-to-phase conversion circuit 615 may include various components of the other transmitter embodiments discussed herein, such as pre-processor circuit 310 and phase control circuit 315 (and corresponding components thereof) as shown in FIG. 3. Polar amplifier 625 may receive both the amplitude component, R(t) 635, and phase-modulate circuit $\phi''(t)$ 642, and generate an RF output signal based thereon.

Figure 7:
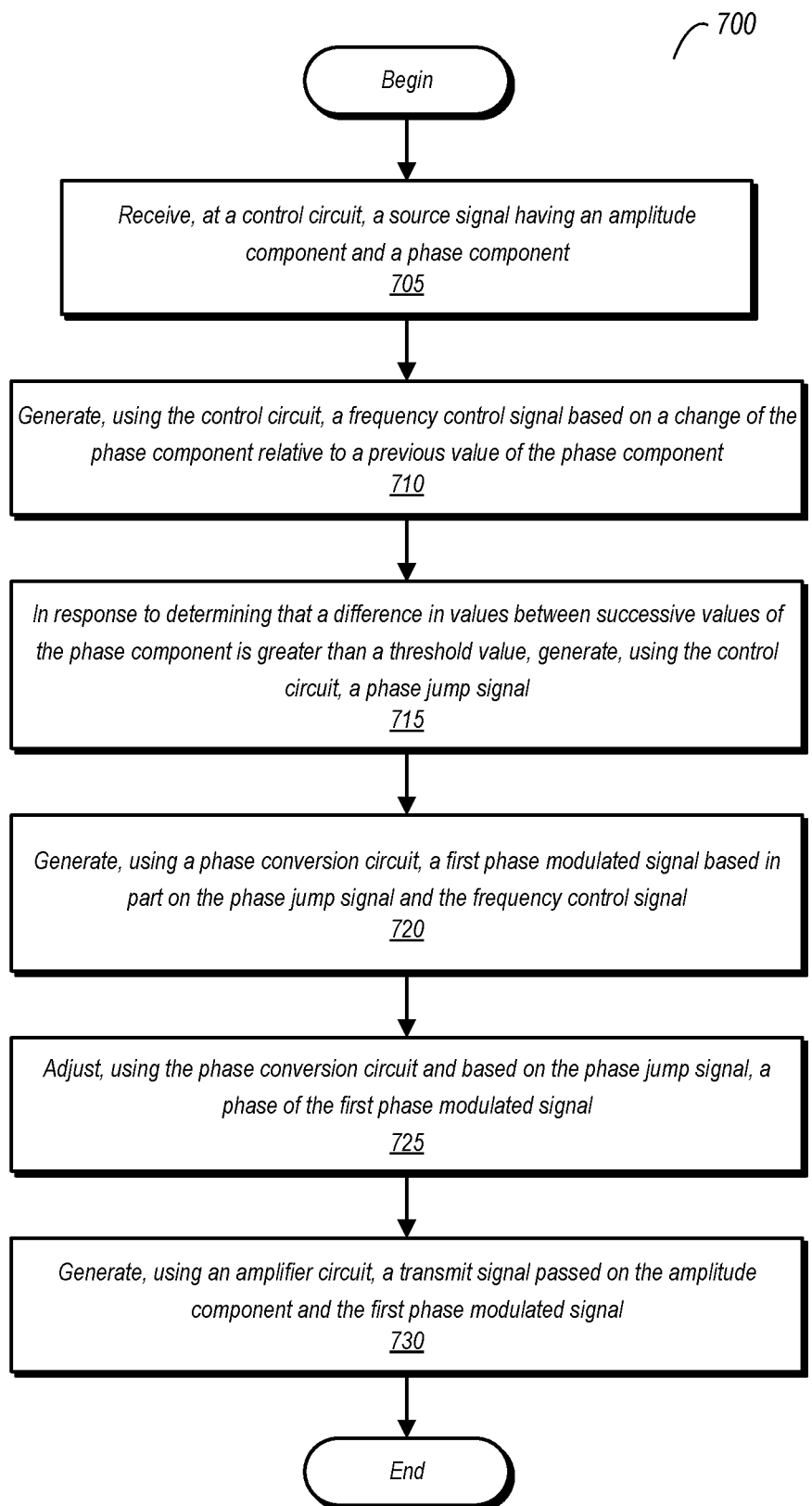
FIG. 7 is a flow diagram illustrating one embodiment of a method for operating a transmitter system.

FIG. 7 is a flow diagram illustrating one embodiment of a method for operating a transmitter system. Method 700 as illustrated herein may be performed with various embodiments of the transmitters and components thereof shown and discussed with reference to FIGS. 1-7. Apparatus embodiments not explicitly discussed herein, but capable of carrying out Method 700, also fall within the scope of this disclosure.

Method 700 begins with receiving, at a control circuit, a source signal having an amplitude component and a phase component (block 705). Using this source signal, the method continues with generating, using the control circuit, a frequency control signal based on a change of the phase component relative to a previous value of the phase component (block 710). In response to determining that a difference in values between successive values of the phase component is greater than a threshold value, the method includes generating, using the control circuit, a phase jump signal (block 715). The method further includes generating, using a phase conversion circuit, a first phase-modulate signal based in part on the phase jump signal and the frequency control signal (block 720). Continuing on, Method 700 further includes adjusting, using the phase conversion circuit and based on the phase jump signal, a phase of the first phase-modulate signal (block 725), and generating, using an amplifier circuit, a transmit signal passed on the amplitude component and the first phase-modulate signal (block 730).

In various embodiments, generating the frequency control signal comprises the control circuit performing a quantization of the phase (or frequency) difference, wherein the quantization is performed using non-uniform step sizes. Generating the first phase-modulated signal includes providing the frequency control signal to a phase locked loop (PLL) implemented in the phase conversion circuit. Generating the first phase-modulate signal also includes generating, using the PLL, a second phase-modulate signal based on the frequency control signal and a reference signal, wherein the nominal frequency of the second phase-modulate signal is greater than that of the desired RF carrier frequency. Generation of the frequency control signal may be performed such that the range of voltages applied to a VCO of the PLL are maintained within a range that enables a practical VCO design. In particular, a VCO that utilizes switched capacitance in an LC tank circuit may be more easily designed if the input voltage variations are kept within a particular range.

In various embodiments, the nominal frequency of the first phase-modulated signal may be the same of RF signals to be transmitted by the transmitter system. As noted above, the nominal frequency of the second phase-modulated signal may be greater than that of the desired RF carrier. Accordingly, the method may further include dividing, using a divider circuit, the frequency of the second phase-modulate signal, and selecting one of a plurality of phases output by the divided circuit as the output phase-modulate signal.

In some embodiments, the PLL is a two-point PLL. In such embodiments, the method may further include providing the frequency control signal to a first point in a forward path of the PLL and to a second point in a feedback path of the PLL.

Some embodiments of the transmitter may be arranged to transmit OFDM signals. Accordingly, in such embodiments, determining that the difference in values between successive values of the phase component comprises determining an instantaneous frequency of an OFDM signal.

Figure 8:
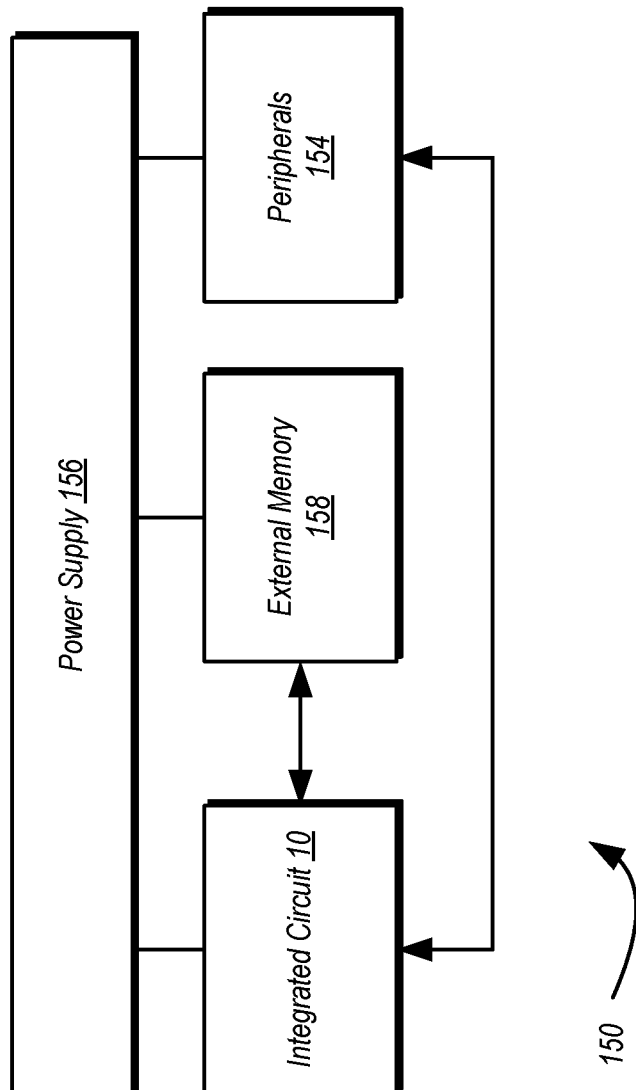
FIG. 8 is a block diagram of one embodiment of an example system.

Turning next to FIG. 8, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments, one or more components of system 150 may include transmitter circuits and components thereof as discussed above in reference to FIGS. 1-7. For example, peripherals 154 may include one or more RF communications systems that include transmitters configured to perform polar modulation and transmit signals accordingly. Such transmitters may be further configured to transmit OFDM signals. These transmitters may include control/pre-processor circuits that perform the various functions discussed above (e.g., non-uniform quantization of a frequency shift value), phase control circuits, and polar amplifiers configured to generate RF output signals.

Numerous variations and modifications will become apparent to those skilled in the art once the above disclosure is fully appreciated. It is intended that the following claims be interpreted to embrace all such variations and modifications.

What is claimed is:

1. An apparatus comprising:
a control circuit configured to:
receive a phase component of a source signal having an amplitude component and the phase component;
generate a frequency control signal using the phase component; and
in response to a determination that a difference in values between successive values of the phase component is greater than a threshold value, generate a phase jump signal;
a phase conversion circuit configured to:
generate, based on the frequency control signal a reference signal, a first phase-modulate signal; and
adjust a phase of the first phase-modulate signal using the phase jump signal; and
an amplifier circuit configured to generate a transmit signal using the amplitude component and the first phase-modulate signal.

2. The apparatus of claim 1, wherein to generate the frequency control signal, the control circuit is further configured to limit a number of discrete values included in the frequency control signal.

3. The apparatus of claim 1, wherein the control circuit is configured to, in generating the frequency control signal, perform a non-uniform quantization of the difference in values between successive values of the phase component.

4. The apparatus of claim 1, wherein the phase conversion circuit includes a phase-locked loop circuit and a phase shift circuit, wherein the phase-locked loop circuit is configured to generate a second phase-modulate signal, and wherein the phase shift circuit is configured to:
generate a plurality of phase-shifted versions of the second phase-modulate signal; and
select a particular one of the plurality of phase-shifted versions of the second phase-modulate signal to generate the first phase-modulate signal.

5. The apparatus of claim 1, wherein the phase conversion circuit includes:
a phase-locked loop circuit configured to generate a second phase-modulate signal that has a frequency greater than a frequency of the transmit signal;
a divider circuit configured to generate a plurality of frequency-divided signals; and
a selection circuit configured to select, using the phase jump signal, a particular one of the frequency-divided signals to generate the first phase-modulate signal.

6. The apparatus of claim 1, wherein the phase conversion circuit includes:
a voltage-controlled oscillator configured to generate the first phase-modulate signal using a voltage level of a control signal;
a frequency divider circuit configured to generate a feedback signal using the first phase-modulate signal and the phase jump signal;
a phase detector circuit configured to compare respective phases of the reference signal and the feedback signal to generate the control signal;
a filter circuit configured to filter the control signal; and
a summation circuit configured to adjust the voltage level of the control signal using the frequency control signal.

7. The apparatus of claim 1, wherein the phase conversion circuit includes a two-point phase-locked loop configured to generate an output signal having a frequency dependent in part on the frequency control signal and the reference signal.

8. The apparatus of claim 1, further comprising an orthogonal frequency division multiplexing (OFDM) signal source configured to generate the source signal as an OFDM signal.

9. The apparatus of claim 8, wherein to determine the difference in values between successive values of the phase component, the control circuit is configured to determine a phase shift between two successive samples of the OFDM signal.

10. A method comprising:
receiving, at a control circuit, a source signal having an amplitude component and a phase component;
generating, using the control circuit, a frequency control signal based on a change the phase component relative to a previous value of the phase component;
in response to determining that a difference in values between successive values of the phase component is greater than a threshold value, generating, using the control circuit, a phase jump signal;

generating, using a phase conversion circuit, a first phase-modulate signal based in part on the phase jump signal and the frequency control signal;

adjust, using the phase conversion circuit and based on the phase jump signal, a phase of the first phase-modulate signal; and generating, using an amplifier circuit, a transmit signal passed on the amplitude component and the first phase-modulate signal.

11. The method of claim 10, wherein generating the frequency control signal comprises the control circuit performing a quantization of the difference, wherein the quantization is performed using non-uniform step sizes.

12. The method of claim 11, wherein determining that the difference in value between successive values of the phase component comprises determining a phase change in successive values of an OFDM signal.

13. The method of claim 10, wherein generating the first phase-modulate signal comprises:

providing the frequency control signal to a phase locked loop (PLL) implemented in the phase conversion circuit; and generating, using the PLL, a second phase-modulate signal based on the frequency control signal and a reference signal, wherein a frequency of the second phase-modulate signal is greater than that of the first phase-modulate signal.

14. The method of claim 13, further comprising:

dividing, using a divider circuit, the frequency of the second phase-modulate signal; and selecting one of a plurality of phases output by the divided circuit as the first phase-modulate signal.

15. The method of claim 13, wherein the PLL is a two-point PLL, and wherein the method further comprises providing the frequency control signal to a first point in a forward path of the PLL and to a second point in a feedback path of the PLL.

16. A system comprising:

a signal source configured to generate a first signal having an amplitude component and a phase component;

a processor circuit configured to:
  generate a frequency control signal based on a phase difference between a current sample of the first signal and a previous sample of the first signal, wherein to generate the frequency control signal, the processor circuit is configured to perform a non-uniform quantization on the phase difference; and
  generate a phase select signal based on an instantaneous frequency value;

a phase control circuit configured to:
  generate a second signal based in part on the frequency control signal;
  divide a frequency of the second signal to generate a third signal; and
  select, based on the phase select signal, a particular one of a plurality of phases of the third signal; and an amplifier configured to generate a fourth signal based on the amplitude component and the third signal.

17. The system of claim 16, wherein the phase control circuit includes a 2-point phase-locked loop (PLL) coupled to receive the frequency control signal at a first point in a forward path and at a second point in a feedback path.

18. The system of claim 16, wherein the 2-point PLL includes a voltage-controlled oscillator (VCO), and wherein the processor circuit is configured to, in generating the frequency control signal, limit a change of a frequency of the second signal to a value that is less than the phase difference.

19. The system of claim 16, wherein the signal source is configured to generate the first signal as an OFDM signal.

20. The system of claim 19, wherein the signal source includes:

an OFDM signal source configured to generate the OFDM signal; and a coordinate rotation digital computer (CORDIC) configured to generate the phase component using the OFDM signal.

* * * * *